(12) United States Patent
Honjyou

(10) Patent No.: US 6,313,827 B1
(45) Date of Patent: Nov. 6, 2001

(54) COMPUTER DATA RE-PRESENTATION APPARATUS AND METHOD

(75) Inventor: Terubumi Honjyou, Hiratsuka (JP)

(73) Assignee: Eastech Corporation, Tokyo (JP)

( * ) Notice: Subject to any disclaimer, the term of this patent is extended or adjusted under 35 U.S.C. 154(b) by 0 days.

(21) Appl. No.: 09/263,565

(22) Filed: Mar. 8, 1999

(30) Foreign Application Priority Data

Sep. 28, 1997 (IL) ........................................ 121843

(51) Int. Cl.[7] ........................... G09G 5/00; G09G 5/05
(52) U.S. Cl. ................... 345/163; 345/156; 345/168; 345/172
(58) Field of Search ...................... 345/156, 163, 345/168, 169, 172

(56) References Cited

U.S. PATENT DOCUMENTS

| | | | | |
|---|---|---|---|---|
| 5,457,480 | * | 10/1995 | White | 345/163 |
| 5,706,031 | * | 1/1998 | Brendzel et al. | 345/172 |
| 5,717,430 | * | 2/1998 | Copland et al. | 345/168 |
| 5,896,125 | * | 4/1999 | Niedzwiecki | 345/168 |
| 5,898,425 | * | 3/1999 | Sekine | 345/168 |
| 5,920,308 | * | 7/1999 | Kim | 345/169 |
| 6,014,131 | * | 1/2000 | Barry et al. | 345/172 |

\* cited by examiner

*Primary Examiner*—Bipin Shalwala
*Assistant Examiner*—David L. Lewis
(74) *Attorney, Agent, or Firm*—William W. Haefliger

(57) ABSTRACT

In combination with a personal computer having internal driving circuitry, a key data input keyboard, and a mouse for computer cursor control, the improvement apparatus for effecting re-presentation by the computer of selected pre-prepared start-up data, comprising a microcomputer associated with the mouse and having memory to store start-up mouse operation data, key operation data, and associated operation time interval data, which has been pre-prepared, there being a mouse signal line or lines to the computer internal circuitry, and a keyboard signal line or lines to the computer internal circuitry, a microcomputer controllably connected to mouse signal line or lines and to the keyboard signal line or lines to transmit from memory to the computer internal circuitry stored, pre-prepared i), ii), and iii) data, to thereby automatically effect start-up drive control of the computer.

15 Claims, 12 Drawing Sheets

COMPUTER DATA RE-PRESENTATION APPARATUS AND METHOD

BACKGROUND OF THE INVENTION

This invention concerns an automatic computer operation system, and particularly a system which stores in memory, at a mouse, operation information which reproduces computer processes and executes computer operations, automatically.

Up to now, each step of a personal computer (pc) operation has been extremely difficult and puzzling for the inexperienced beginner, so that various guide books and instruction manuals have been prepared, and also in the pc software an explanatory note is included in the form of a HELP request.

However, when the beginner reads these materials, understands and tries to operate the pc according to the operational instructions, he is sure to meet with difficulty in pc basic operations, because of his little or no knowledge of specialized terminology, and also because of his inability to locate the position of the designated object at the display screen.

Therefore, in case of no support or no guidance from an operation expert, the beginner is always compelled to repeat so-called TRY and ERROR requests or to waste his time and labor looking into the explanatory booklet.

A series of pc operations, such as pc start-up and stop operations, a connecting operation to pc telecommunication etc. requires repetition of the same operations each time.

Even the experienced operator finds such repeated operations troublesome and wishes to eliminate them. To the inexperienced operator, these repeated operations have become major reasons for causing resistance to, as well as the allergy against, the pc.

Currently, as a means of simplification of these operations, a command signal is pre-registered as the start-up program by key operation of the keyboard, and this program is automatically run at the time the pc is switched on. The macro-program is also executed by one of these means.

In case these means are executed, however, the number of memorizable programs is very limited, so it becomes very difficult to place into MEMORY and to reproduce a few hundred to several thousand kinds of mouse and keyboard operation processes.

In addition, at the time of pa start-up and pc switch-off, a series of key operations and mouse operations have been required. Unfortunately, there have been no easy or convenient measures designed to eliminate all these operations and to obtain the desired pc screen display or to switch off the pa power supply after a series of required operations, by means of only one designated command key operation.

There are certain measures available which are intended for similar functions to those earlier mentioned, but in these cases, it is necessary to install the designated software, and to re-arrange the basic pc setup, which the inexperienced operator finds extremely difficult.

Currently, various kinds of pc operations are explained at the display screen in the form of HELP on-screen references, but because of difficult terms the beginner meets with difficulties, almost everywhere, in locating the designated position at the display screen.

Even in the case of a macro program, it must only be executed during the operation of the designated software. In addition, the display screen change and development during macro program execution is too fast for the beginner to learn about the interim processes and procedures. In addition, the use of a macro program involves a click operation or operations at some points, and even this poses some difficulties for the pc beginner.

SUMMARY OF THE INVENTION

The present invention eliminates such problems as above mentioned.

One of the solutions is to pre-store in memory at the mouse the data for a series of mouse and key operation processes as for a designated task, as well as pc operation information, with their associated operation time interval data. With such pre-arrangement done, by switching on the start-up signal after designation of the identification number to determine the intended pc processing job, at a mouse keyboard, an operator or operators inclusive of the beginner can make the entire operation automatic, from reproduction of a series of mouse and keyboard operations pre-stored in the memory-built-in type device in question, as earlier mentioned, according to the pre-memorized time passage, to re-presentation of all the respective pc operations one after another.

In the apparatus of the present invention, a pc operation re-presentation device incorporates a microcomputer designed to control the mouse and the keyboard which are concurrently activated independently of the pc main driving circuitry. That device stores first in the memory of the afore-mentioned microcomputer the pre-arranged mouse operation data, key operation data and operation interval time data, and reproduces from this memory the mouse operation data, key operation data and operation time interval data.

While maintaining the designated operation time interval according to the operation time interval data of the reproduced data, the device generates from the reproduced mouse operation data and key operation data the mouse control signal and key code signal, and outputs these signals out of the output terminal of the microcomputer, and inputs them into the mouse signal lead wire and the keyboard signal lead wire respectively, and resultantly operates and controls the pc automatically.

This invention is characterized as by the following objects or measures for pc operation data production and its input.

One measure is for shifting the mouse cursor in the pc display screen in the up/down and left/right directions, by inputting the mouse driving pulse generated from the device into the afore-mentioned mouse socket by means of operation of a button on the device and connected to the pc mouse socket an exterior adaptor.

Another measure or object is for counting the number of shift pulses at the time of cursor shifting, by means of button operation.

Another measure is for storing cursor operation data in the memory at the mouse and reproducing the mouse cursor operation data, inclusive of the number of shift pulses.

Another measure is for shifting the mouse cursor to the designated position by means of a control button, and storing at this position, by pushing the designated button, the shift distance of the mouse cursor in accordance with the afore-mentioned shift pulse number data in the memory of the device, and at the same time inputting the click signal for each of the mouse right and left switchings generated from the device, into the pc mouse socket and inputting the click signal into the computer.

Another measure is for storing in the memory the mouse operation data inclusive of the instructions as to necessity or lack of necessity of click operation, and the click to click interval time data.

The device in question is also designed to provide to its user the pc operation information consisting of the afore-mentioned mouse operation data, key operation data and the operation time interval data, which are prepared in advance by the pc specialist or the pc-oriented individual.

The pc operation re-presentation device of the invention device is designed to put in a group a series of pc operation data, to give each group its identification number, and to store in the memory of the afore-mentioned microcomputer the pc operation-information in plural groups. Then, at the time of signal reproduction from the pc operation memory, the device re-presents the designated pc operation information, by inputting the user's identification number, to choose one of the plural groups according to the input identification number and reproducing it.

The method for executing the afore-mentioned pc operation information memory/reproduction is further described as follows:

The afore-mentioned mouse operation data and key operation data, and the operation time interval data are to be so configured that the cursor is shifted to a very slight distance, in accordance with one shift pulse, for cursor shift input into the afore-mentioned mouse signal, and the cursor shift distance is put into data as the shift pulse numerical value, and the cursor shift direction and click movement are put into data in accordance with each numerical value, and the time interval from one click to another is put into data in accordance with its numerical value.

Further, the numerical value for the cursor shift direction at the display screen, shift pulse number for the shift distance, and the numerical value for the time interval to the next click are formed into one set of data in accordance with the mouse operation intended for reproduction of plural groups which are formed into successive groups, and stored in the semiconductor memory as mouse operation data consisting of a series of mouse operation process data.

The method for executing the pc operation, information operation re-presentation process, stored in the afore-mentioned memory is further explained as below described:

The mouse operation reproduction signal reproduced at the time of pc operation, via the information re-presentation device, is activated by the pulse-combination input into two signal lead wires in order to shift the cursor in the display screen in the X-axis direction and in the Y-axis direction, and thereby to control the cursor shift direction, by the difference between both pulses.

Shifting of the cursor in the right/left direction of X-axis, and in the up/down direction of Y-axis, is effected by shifting the cursor by one shift of the designated distance at each input of one set of X and Y pulses, and inputting a group of shift pulses consisting of the afore-mentioned pulses.

There are many methods for putting the invention into practice in a concrete manner.

One method is for installing in the interior of the afore-mentioned mouse device the microcomputer chip for the afore-mentioned pc operation information control.

Another method is for installing the microcomputer chip for the afore-mentioned pc operation information control, in the interior of the mouse device equipped with a keyboard designed to designate and choose the identification number, for one specific pc operation job, by means of information from plural groups of pc operation information stored in the memory.

Another method is for installing the microcomputer chip for the afore-mentioned pc operation information, in the interior of the keyboard designed for letter input.

Another method is for installing the microcomputer chip for the afore-mentioned pc operation information, in the interior of the card to be used by insertion into the pc card slot.

Another step is for using the No. 7 pin signal lead wire to input the afore-mentioned pc operation information or keyboard signal into the microcomputer chip for the afore-mentioned pc operation information control installed in the interior of the mouse.

Another step is for starting the afore-mentioned pc operation re-presentation processes, after the cursor in the pc display screen is shifted to the zero (0) positions of X-axis and Y-axis at the upper left corner of the display screen, by reproducing the pc operation information out of the memory of the afore-mentioned microcomputer, and inputting the shift pulse into the pc from the pc operation re-presentation device in the first process of the pc operation re-presentation.

Another step is, in the process of reproducing the pc operation information from the memory of the afore-mentioned microcomputer and pre-setting the pc operation, for making such pc operation re-presentation process stop temporarily at each process and advance it one by one at each designated key operation by the operator.

As earlier explained, the invention enables easy-to-set-up pc operation, designed to eliminate various setup preparations such as in new software, and makes the preparation complete by merely connecting the socket of the device to that of the pc.

Accordingly, it is a further object of the invention to provide a method which includes the steps a) providing a minicomputer associated with the mouse and having a memory for data storage, b) effecting entry into the memory at the microcomputer, and storage, of said start-up data otherwise requiring entry into the computer via keying operation of the keyboard, upon start-up, c) and, upon start-up of the computer, effecting automatic transmission to the computer from said memory of said start-up data, to achieve rapid desired mode presentation at the monitor screen.

As will be seen, such automatic transmission of said start-up data is effected in by-passing relation to the keyboard, whereby rapid start-up is achieved in conjunction with cursor operation of the mouse.

A further object is to provide said method of operation to include effecting such automatic transmission from the memory at the mouse of at least part of the start-up data, via a mouse data transmission terminal provided at the computer.

Yet another object is to provide a keypad at the mouse, for ease of use in conjunction with mouse cursor control operation, for selecting and entering different signals respectively associated with different groups of the start-up data, such automatic transmission effected to transmit to the computer a selected group of start-up data.

These and other objects and advantages of the invention, as well as the details of an illustrative embodiment, will be more fully understood from the following specification and drawings, in which:

DETAILED DESCRIPTION

Figure 1:
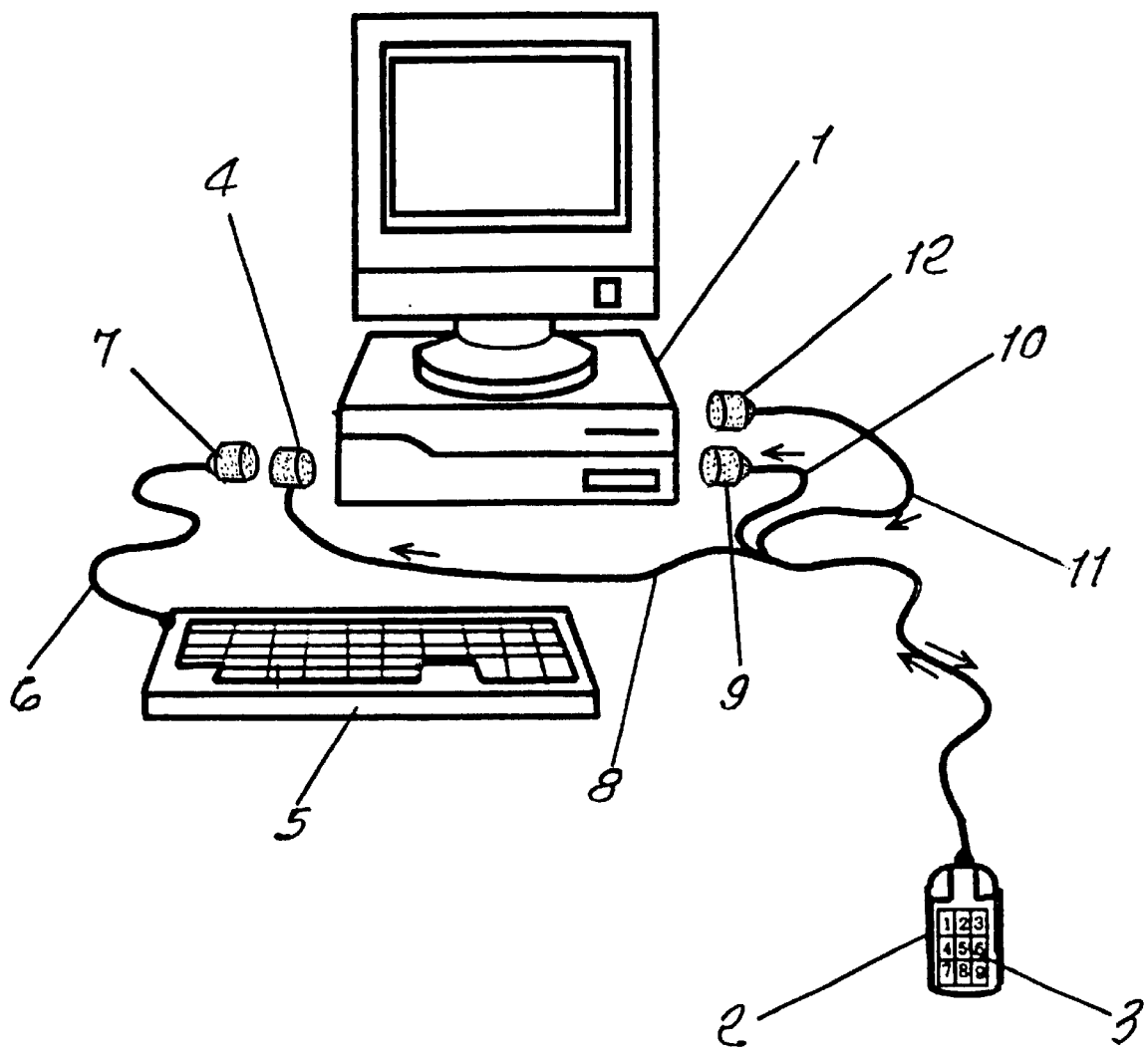
FIG. 1 is the exterior view of the outward construction of the mouse-built-in type pc operation re-presentation device showing the embodiment of one example of practice of the invention.

The personal computer, i.e. pc is seen at 1 in FIG. 1. The number 2 indicates the mouse-built-in type pc operation re-presentation device. The number 3 indicates the ten-key board microcomputer installed in the pc operation re-presentation device. And, at the reproduction mode of the pc operation information, out of plural groups of pc operation data stored in the memory at 3 along with their respective identification numbers, the designated pc operation information is reproduced by means of selected identification number input to the ten-key board device 3. The number 4 is applied to the keyboard insertion socket, inserted between the keyboard socket 7 for the keyboard signal wire 6, consisting of plural lead wires in a bundle and connected to the keyboard numbered as 5. The keyboard code reproduction signal output from the mouse-built-in type pc operation re-presentation device, via signal wire 8, is input into the pc keyboard socket. The number 9 is for the mouse socket. This socket is connected to the pc mouse socket (drawing omitted). The mouse operation reproduction signal output from the mouse-built-in type pc operation re-presentation device 2 is input into the pc mouse socket via the mouse signal lead wire 10 consisting of plural signal lead wires in a bundle and connected to the mouse-built-in type pc operation re-presentation device 2. The number 11 is for the pc operation data input lead wire. And, by connecting pc operation data input lead wire socket numbered as 12 to the PC R5232C socket (drawing omitted), pc operation data output from pc 1 are transmitted to the mouse-built-in type pc operation re-presentation device 2.

Figure 2:
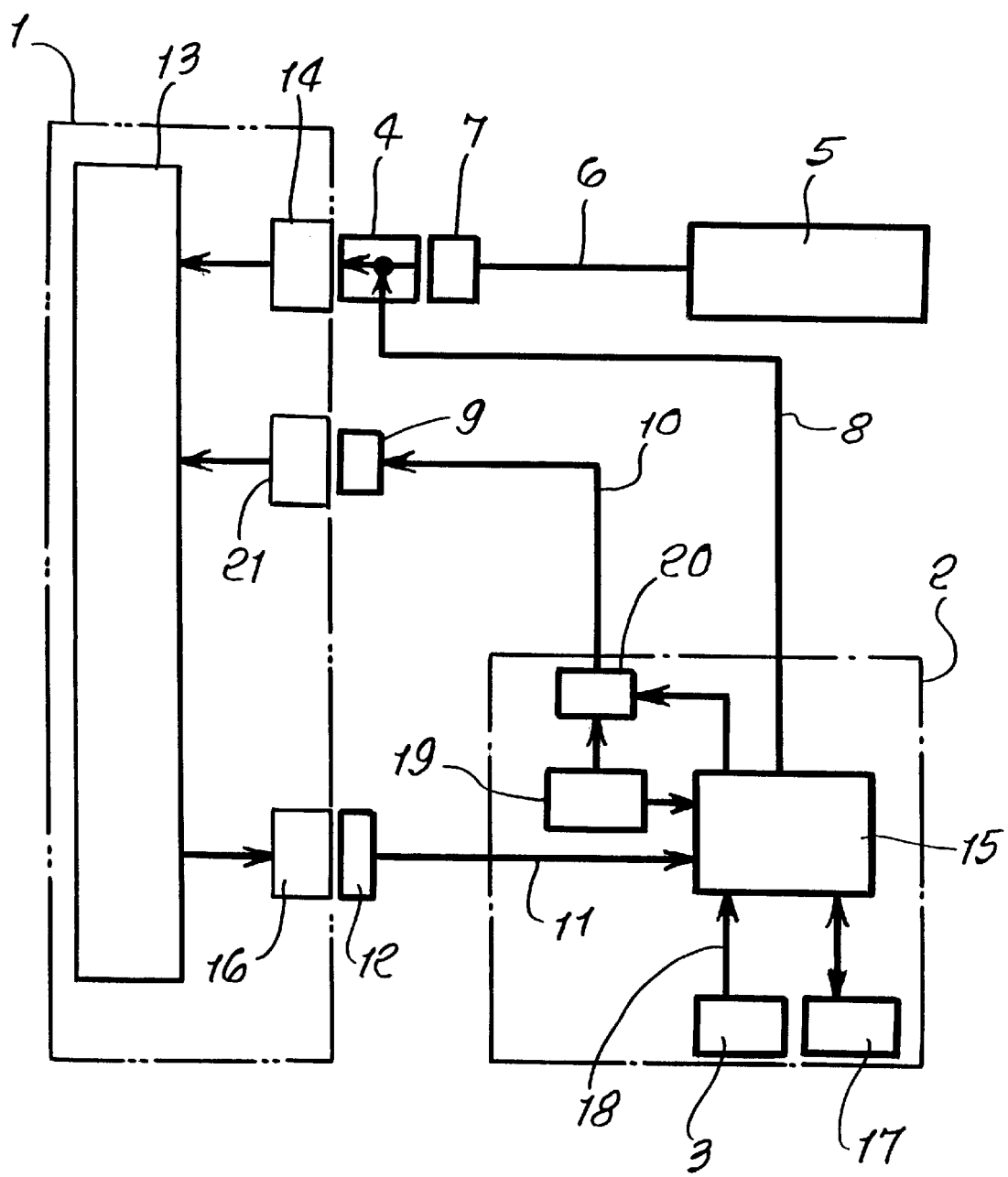
FIG. 2 is the circuit block diagram for the mouse-built-in type pc operation re-presentation device.

Reference is Now Made to the Block Diagram of FIG. 2.

The number 13 is for computer circuitry for the pc numbered as 1. The number 5 is for the keyboard which outputs the keycode signal and inputs this keycode signal circuit numbered as 3 into the pc through keyboard signal lead wire numbered as 6 and keyboard socket numbered as 7, keyboard insertion socket numbered as 4, and pc keyboard socket numbered as 14.

The number 15 is for one-chip microcomputer installed in the pc operation re-presentation device numbered as 2, and at the time of memory mode of pc operation information, inputs pc operation data output from RS232C socket numbered as 16 of pc numbered as 1, into the mouse-built-in type pc operation re-presentation device numbered as 2, through pc operation data input lead wire socket numbered as 12 and pc operation data input lead wire numbered as 11, and then stores in the memory numbered as 17 the keyboard operation signal data and mouse operation signal data as the pc operation information, together with each respective operation timing data.

Next, at the reproduction mode of pc operation information, the key operation signal reproduced according to the pc operation information reproduced from the memory numbered as 17 is input into the pa keyboard socket numbered as 14 via key operation reproduction signal lead wire numbered as 8 and keyboard insertion socket numbered as 4.

The number 19 is for the mouse signal generation section of the conventional mouse, where the pulse signal is generated by detection of the mouse ball rotation when the user operates manually the mouse-built-in type pc operation re-presentation device numbered as 2.

The number 20 is for the manual operation mouse signal change-over switch. This switch selects the manual mouse operation signal output form the mouse signal generation numbered as 19, or the mouse operation reproduction signal output from the microcomputer chip numbered as 15, and outputs the selected signal into the mouse signal lead wire numbered as 10, and inputs it into the computer circuitry numbered as 13 of the pc numbered as 1 via mouse socket numbered as 9 and pc mouse socket numbered as 21.

The number 3 is for the ten-key board installed in the mouse-built-in type pc operation reproduction device numbered as 2. At the reproduction mode of pc operation information, this ten-keyboard inputs the identification number into the memory numbered as 17 and places it into memory there.

And, at the reproduction mode of pc operation information, the designated pc operation information is reproduced at the operation of ten-keyboard numbered as 3, from plural pc operation information groups put into the memory numbered as 17 with each identification number given, by inputting the respective number into one-chip microcomputer via ten-keyboard signal numbered as 18.

Although the memory numbered as 17 is shown as the exterior installation in this illustration, the method for installing in the memory the one-chip microcomputer without the exterior memory is also practicable.

Figure 3:
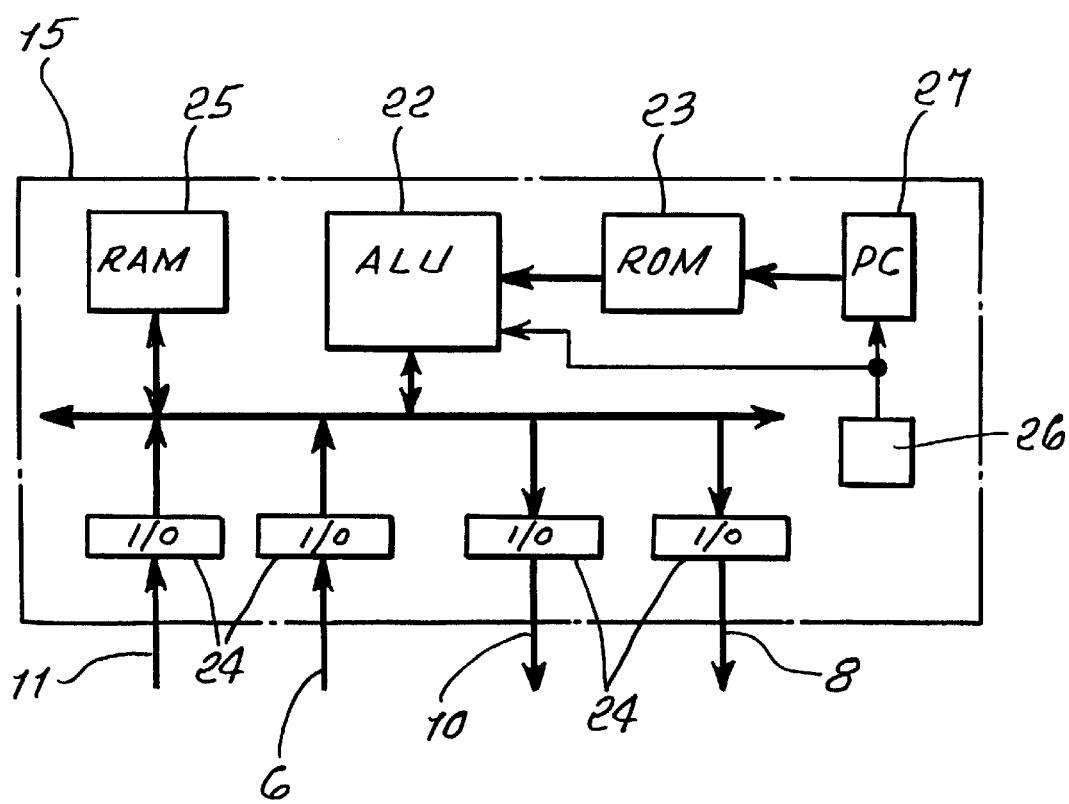
FIG. 3 is the circuit block diagram for the microcomputer chip installed in the pc operation re-presentation device.

Reference to FIG. 3.

The number 15 is for the one-chip microcomputer installed in the afore-mentioned pc operation re-presentation device numbered as 2. The number 22 is for the operation information memory/reproduction control section (ALU). which is designed to execute the program to control the movement of the actual practice instance of the invention in question.

The number 23 is for the control program memory section (ROM) designed to memorize the control program as earlier mentioned. The number 24 is for the I/O interface section designed to control the input/output of operation signal data. The number 25 is for the pc operation information memory section (RAM or PROM) in the interior of microcomputer.

The number 26 is for the timer designed to provide time data to operation information memory/reproduction section numbered as 22 and to program counter numbered as 27. The number 8 is for the key operation reproduction signal lead wire.

The number 10 is for the mouse signal lead wire. The number 6 is for the keyboard signal lead wire. The number 11 is for pc operation data input lead wire through which pc operation information is input into one-chip microcomputer numbered as 15.

Figure 4:
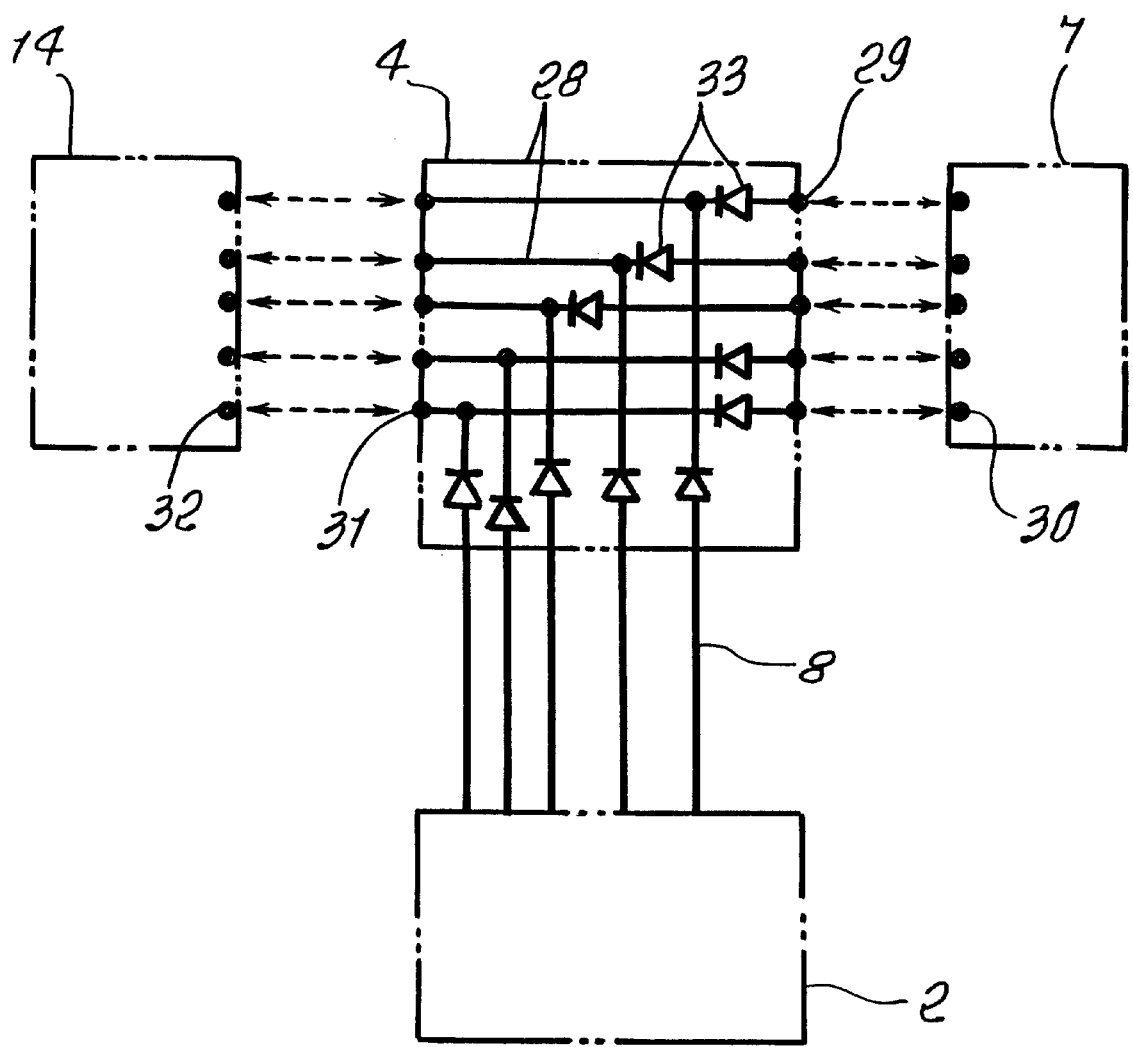
FIG. 4 is the circuit block diagram for the keyboard insertion socket numbered as 4.

Reference to FIG. 4.

The number 28 is for the internal wiring for the keyboard insertion socket numbered as 4. This wiring connects the connection terminal numbered as 402 for the keyboard socket numbered as 7 with the connection terminal numbered as 29, and also connects the connection terminal numbered as 14 with connection terminal numbered as 31, and also with key operation reproduction signal lead wire numbered as 8 for the pc operation re-presentation device numbered as 2.

The number 33 is for the diode which prevents the backward flow of each output signal to the keyboard numbered as 5 and to the pc operation re-presentation device numbered as 2.

Figure 5:
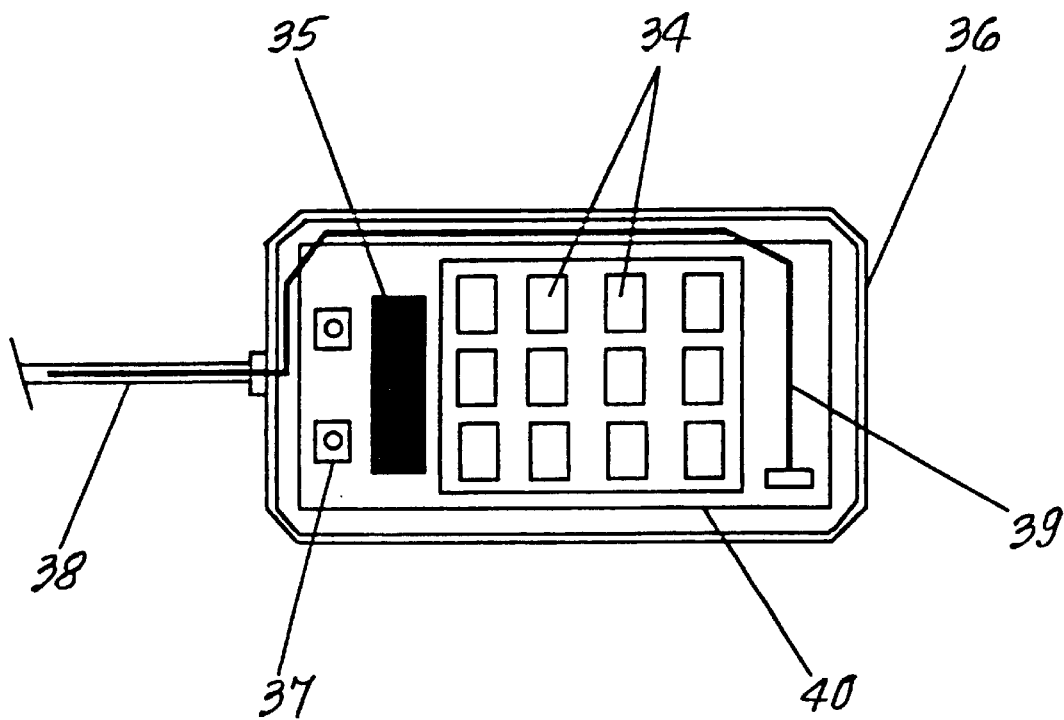
FIG. 5 is the plane figure for the internal construction of the mouse-built-in type pc operation re-presentation device.
Figure 6:
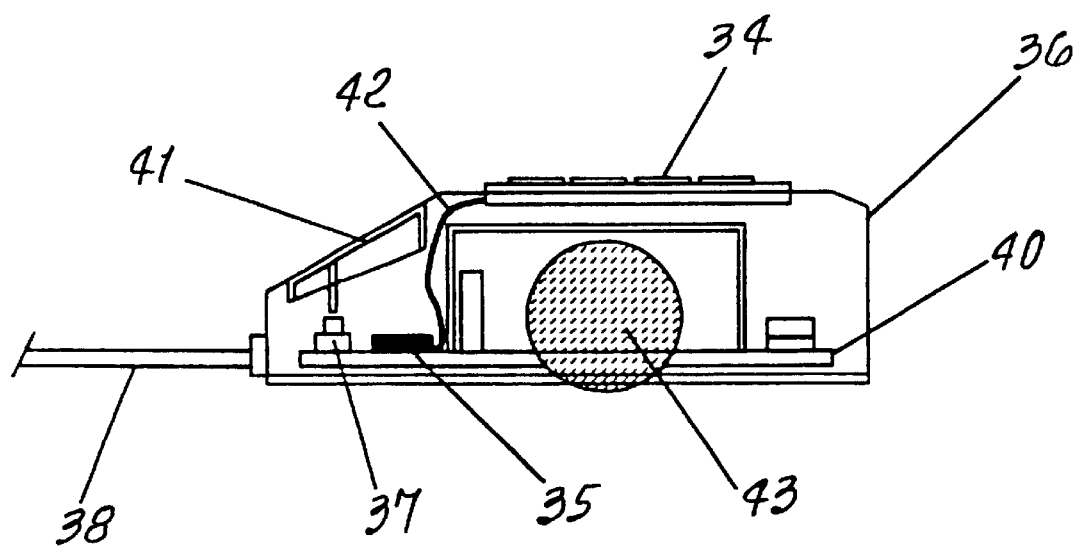
FIG. 6 is the cross section drawing for the internal construction of the mouse-built-in type pc operation re-presentation device.

FIG. 5 is for a plane figure for the internal construction of the mouse-built-in type pc operation re-presentation device numbered as 2 as shown in FIG. 1. FIG. 6 is for a cross section drawing for the internal construction of the mouse-built-in type pc operation re-presentation device numbered as 2. The number 34 in this Figure is for the ten-keyboard designed to input key operation data into microcomputer chip numbered as 35.

The number 35 is for the microcomputer chip for the memory/reproduction of the afore-mentioned pc operation information. The number 36 is for the mouse itself. The number 37 is for the click switch. The number 38 is for the mouse cable. The number 39 is for the mouse signal lead wire.

The number 40 is for the circuit board. The number 41 is for the click button. The number 42 is for the keyboard cable. The number 43 is for the mouse ball.

Figure 7:
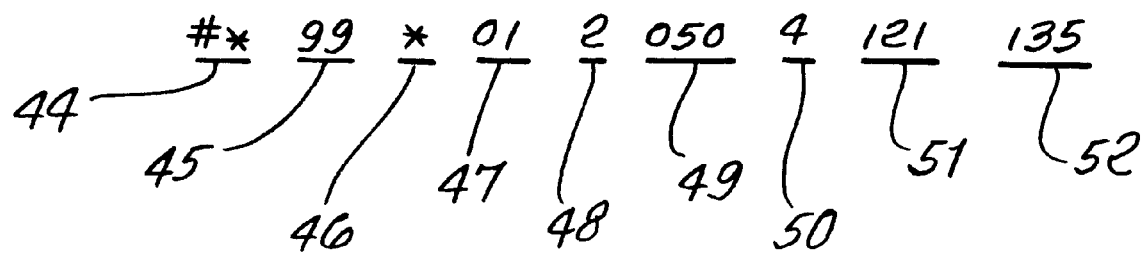
FIG. 7 is the data configuration drawing for the mouse operation data.

FIG. 7 is for the data configuration for one actually executed case of the mouse operation data in the pc operation information. #* of the number 44 is for prefix mark set for the pc operation data, and the same pc operation data group for a series of processing is memorized and reproduced as one group.

The number 45 is for the address data. The address data are set up according to each of pc operation information groups, and this code number is used as memory address.

The asterisk * of the number 46 is for the prefix mark code for the beginning of the mouse operation data, and its successive 13 code numbers are processed as he mouse operation information data.

The number 47 is for the code number for the mouse click status, and 00 indicates "no click", 01 indicates "execute click", and 11 indicates "drag".

The number 48 is for the code number indicating cursol shift direction at X-axis to either right or left; 1 is set as right direction and 2 as left direction.

The number 49 is for the number of shift pulse, which activates cursol shift in the direction of X-axis, and accords with the shifting distance of cursol.

The number 50 is for the code number for the up/down shifting direction of cursol at Y-axis; 3 for the downward direction and 4 for the upward direction.

The number 51 is for the number of shift pulse which activates the cursol shift to shift in the direction of Y-axis, and accords with shifting direction of cursol.

The number 52 is for the coded numerical value for the time interval of mouse click, and the value of 1 is set as 1 sec., so the value of 135 indicates 13.5 seconds.

Figure 8:
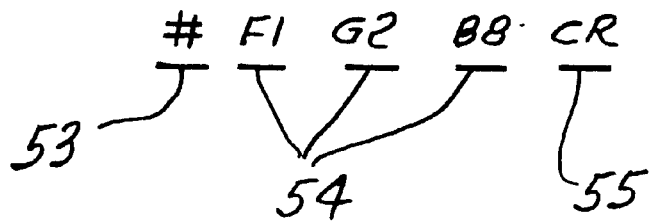
FIG. 8 is the data configuration drawing for the keyboard operation data.

FIG. 8 is for the keyboard operation data configuration in the pc operation information, prepared together with the afore-mentioned mouse operation data.

The # of the number 53 in this figure is for the prefix code for the letter information data. And, for each of its successive letters, a group of key code numbered as 54 are prepared and at the end of the group the enter code numbered as 55 is placed.

Figure 9:
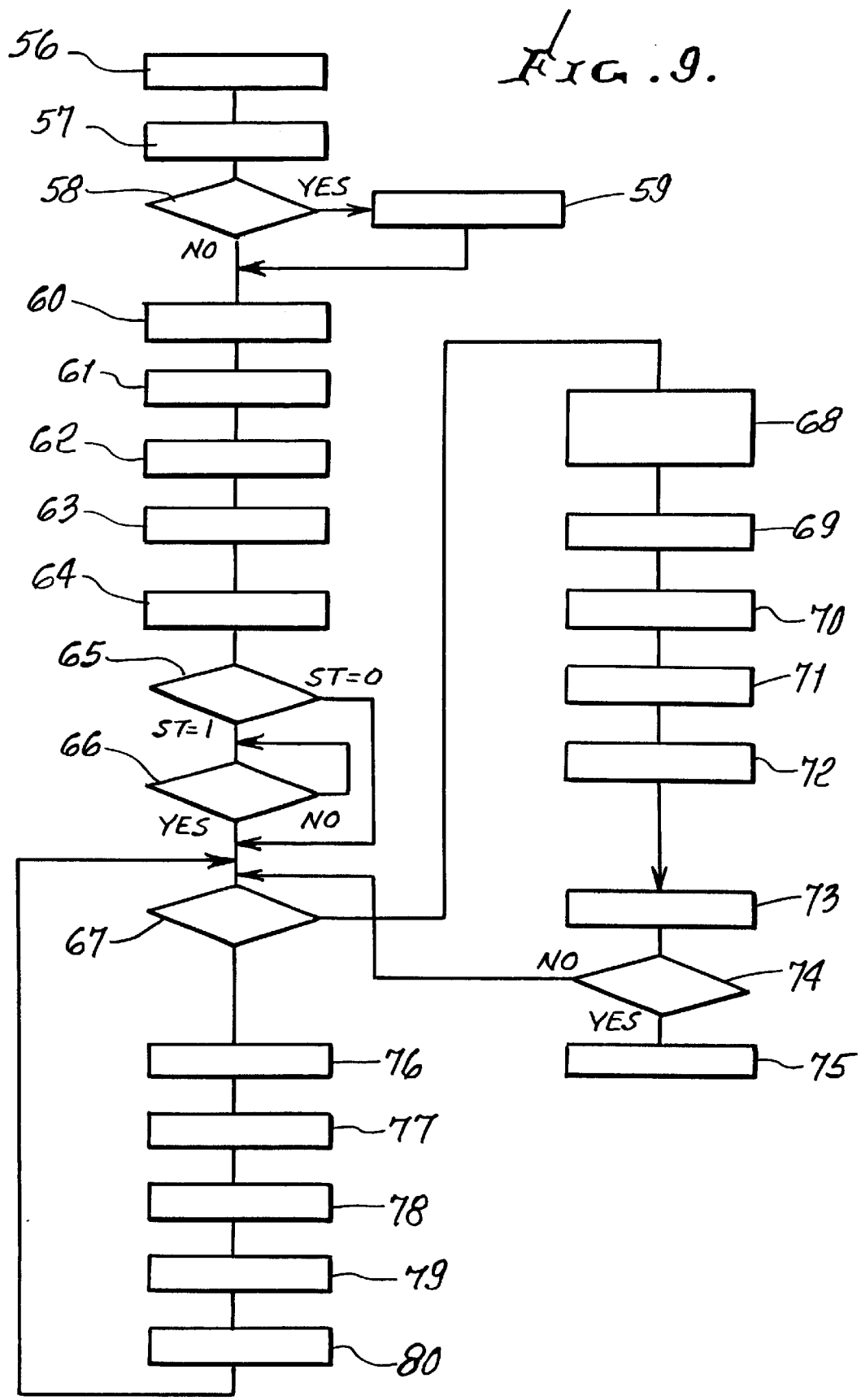
FIG. 9 is the flow chart for operation process at the time of pc automatic operation mode.

FIG. 9 is for the flow chart for the process where the pre-learnt pc operation information is reproduced and the pc is driven to operate automatically. At the time of process advance, each time one pc event is produced by means of each mouse or key operation re-presentation, its advance is temporarily stopped until the user initiates any key operation and one-step advance is made at each key operation. This device is equipped with such one-step advance function as earlier mentioned. First of all, at the operation of ten-keyboard numbered as 3 in FIG. 1, the choice of the designated pc operation information to be re-presented is appointed as the address number input process numbered as 56, and the reproduction job selection call process numbered as 57 is executed.

Here, at the process numbered as 58 where necessity or unnecessity of one-step advance is appointed, by operation of keyboard numbered as 3, in case of one-step advance necessity, at the step flag process numbered as 59, 1 is set at the step flag ST, and in case of no step advance appointment, 0 is set at the step flag ST.

Next, when the pc automatic operation start-up process numbered as 60 is executed, the time counter for the operation interval time control starts according to the process numbered as 61, the operation interval time passage measuring start-up process for the mouse or the key operation.

The number 62 is for the automatic original point return process. In order to return the cursol at the optional display screen position to the original position of the upper left corner section of the display screen, prior to the automatic mouse and cursol operation by automatic pc operation, a group of shift pulse in the left direction of X-axis and a group of shift pulse in the direction of Y-axis are output and then input into the pc numbered as 1, and the cursol in the pc display screen is returned to the original point.

And, when a fixed sufficient time passes for its return to the original point at the process numbered as 63, the next reproduction is executed, and the afore-mentioned group of designated pc operation data reproduced by address appointment is reproduced.

Then, at the step detection process numbered as 65, necessity or necessity of step advancement command is detected. In case 0 is set at step flag ST, and no step command is given, the process is advanced to the next process numbered as 67, and in case 1 is set at step flag ST for one-step command, the process is temporarily stopped at the process numbered as 66 until the key operation is executed.

Then, it is advanced to the next process and at the data classification process numbered as 67, the prefix mark for the reproduced operation data is identified and judges which the reproduced data is, mouse data marked as * or keyboard data marked as #.

In case of mouse signal, after the shift direction, shift number, and time interval data are reproduced at the process numbered as 68, the mouse shift signal output process numbered as 69 is executed according to the reproduction data, and the cursol shift process in the display screen numbered as 70 are executed.

Further on, after the designated time given in the aforementioned reproduction data passes at the process numbered as 71, the click signal is generated at the process numbered as 72, and the process numbered as 73 for the pa activation is executed.

And here, when the automatic operation completion is identified at automatic pc operation completion judgement process numbered as 74, the pc automatic operation is completed at the process numbered as 75.

In case it is not completed, the process is returned to the data classification process numbered as 67, and the processes starting from the number 67 repeat themselves.

On the other hand, in case the key data is identified by # mark at the data classification process numbered as 67, a series of letter line data numbered as 54 and 55 and time interval data numbered as 47 are reproduced at the process numbered as 76, and at the process numbered as 77, reproduced as the group of letter codes which match in with the key data output from the conventional type pc keyboard.

And at the same time, after the designated time passes according to the time data reproduced at the process numbered as 78, a group of letter code signals reproduced at the process numbered as 79 are input into the pc and the pc activation numbered as 80 is executed. After that, the process is returned to the data classification process numbered as 67 and the processes from that numbered as 67 repeat themselves once again.

Figure 10:
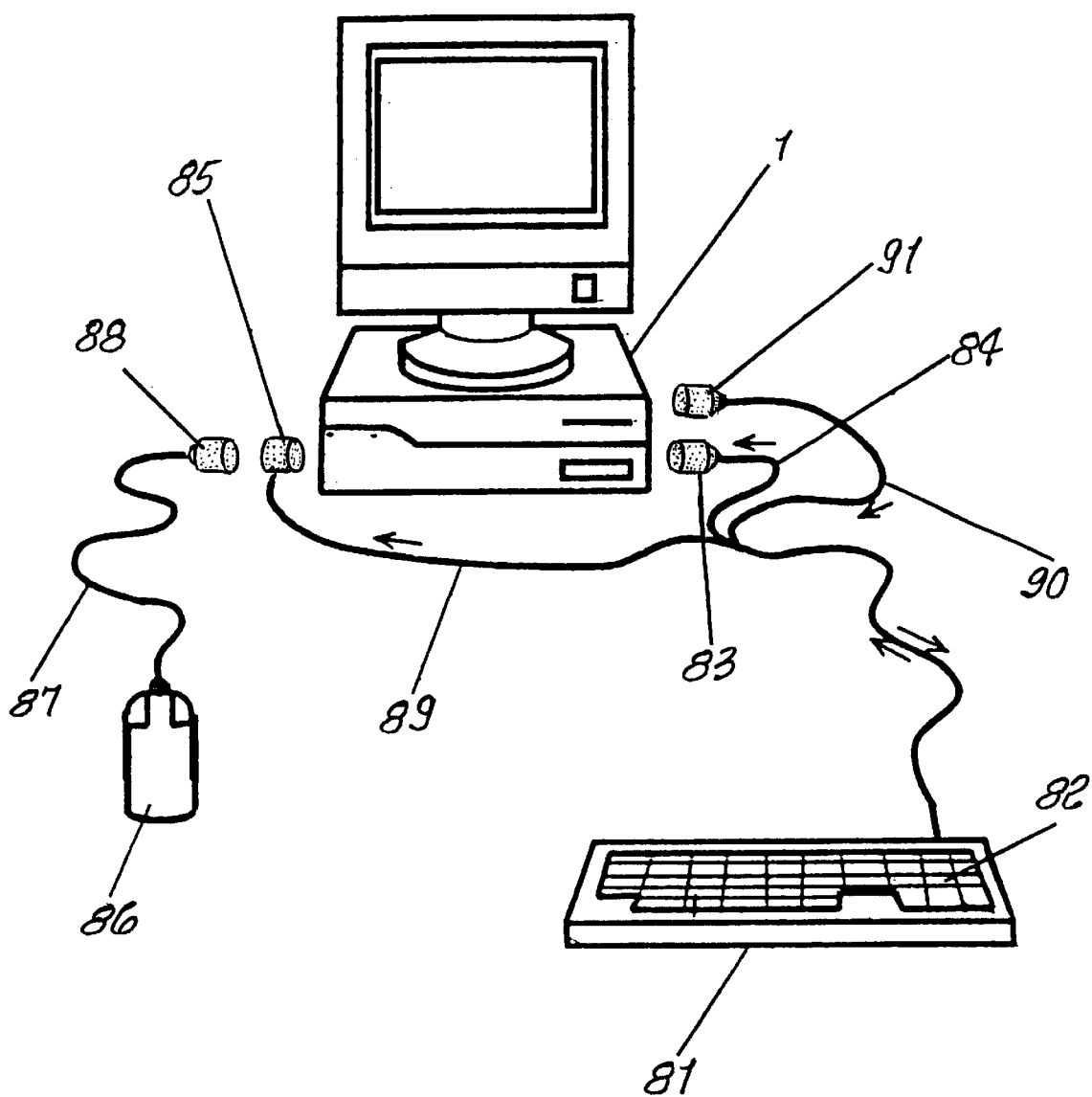
FIG. 10 is the exterior view of the mouse-built-in type pc operation re-presentation device with microcomputer chip for pc operation information control installed in the keyboard body.

FIGS. 1–9 show the preferred apparatus.
Reference to FIG. 10

The number 1 is for the pc. The number 81 is for the keyboard-built-in type pc operation re-presentation device. The number 82 is for the keyboard installed in the keyboard-built-in type pc operation re-presentation device numbered as 81. This keyboard is designed not only to function as the pc keyboard for usual key data input, but also, at the time of pc operation information re-presentation, to input the identification number by the operation of the keyboard numbered as 82, into the microcomputer for the pc operation information memory/reproduction installed in the keyboard-built-in type pc operation re-presentation numbered as 81, and to reproduce the designated pc information out of plural groups of pc operation information stored in the memory along with their respective identification numbers.

The number 83 is for the keyboard socket. This keyboard socket inputs the keycode reproduction signal output from the pc operation re-presentation device numbered as 81, into the pc keyboard (drawing omitted) via the key operation reproduction signal lead wire numbered as 84.

The number 85 is for the mouse socket. This mouse socket is inserted in between the mouse socket numbered as 87 for the mouse signal lead wire consisting of plural signal lead wires put in bundle and connected to the mouse numbered as 86, and the pc mouse socket (drawing omitted), and, via mouse operation reproduction signal lead wire numbered as 89, inputs the mouse operation reproduction signal output from the pc operation reproduction signal output from the pc operation re-presentation device numbered as 81, into the pc mouse socket.

Figure 11:
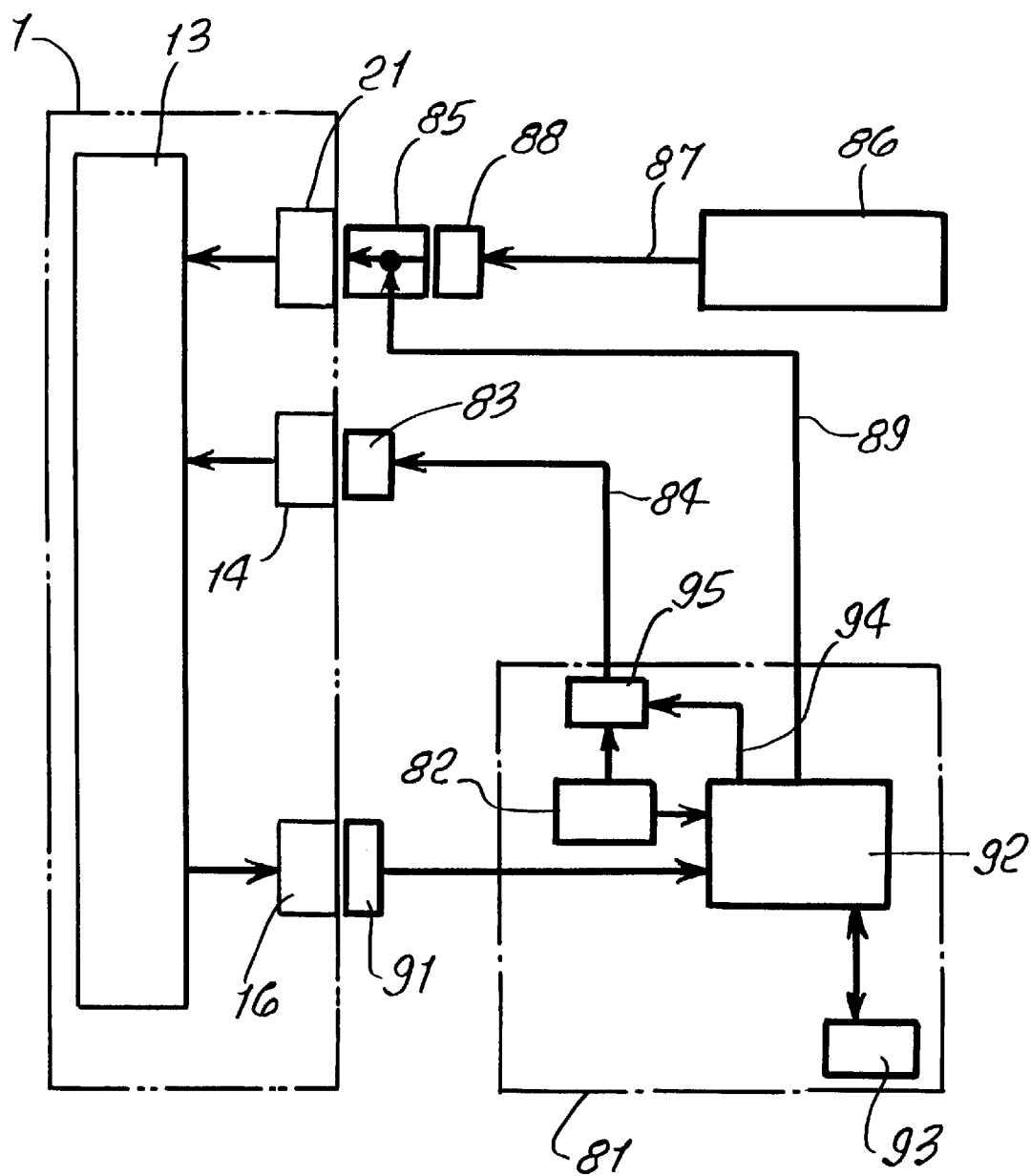
FIG. 11 is the circuit block diagram for the keyboard-built-in type pc operation re-presentation device.

The number 90 is for the pc operation data input lead wire. This connects the data input lead wire socket numbered as 91 to the pc RS232C socket (drawing omitted), and inputs the pc operation data into the keyboard-built-in-type pc operation re-presentation device numbered as 81.
Reference to FIG. 11

The number 13 is for the computer circuitry installed in the pc numbered as 1.

The number 81 is for the keyboard-built-in type pc operation re-presentation device. This device is designed to output the key code signal into the pc circuitry numbered as 13 via key operation reproduction signal lead wire numbered as 84 and keyboard socket numbered as 14.

The number 86 is for the mouse. This mouse is designed to output the mouse signal, and input the mouse signal into the pc circuitry numbered as 13 via the mouse signal lead wires numbered as 87 and 88, and the mouse binsetion socket numbered as 85 and the mouse socket numbered as 21.

Further on, the number 92 is for the one-chip microcomputer installed in the pc operation re-presentation device numbered as 2. At the time of memory mode of pa operation information, this microcomputer is designed to input the pc operation data output form the RS232C socket of the pc numbered as 1, into the mouse-built-in type pc operation re-presentation device numbered as 81 via the pc operation data input lead wire socket numbered as 91 and the pc operation data input lead wire numbered as 90, and to place in the memory numbered as 93 the keyboard operation signal data and the mouse operation signal data together with their respective operation timing data, in the form of pc operation information.

Next, at the reproduction mode of the pa operation information, this device is designed to input the key signal synthesized (composed) according to the pc operation information reproduced from the memory numbered as 93, into the change-over switch numbered as 95 via the key operation reproduction signal lead wire numbered as 94, and at the same time to change over the key operation signal output from the keyboard numbered as 82, and then to input either key operation signal into the pc key socket numbered as 14 via key operation signal lead wire numbered as 84 and key socket numbered as 83.

In addition, the device in question is designed to input the mouse reproduction signal composed according to the pc operation information reproduced from the memory numbered as 93, into the pc mouse socket numbered as 21 via the mouse operation reproduction signal lead wire numbered as 89 and the mouse insertion socket numbered as 85.

The number 82 is for the keyboard. This keyboard is designed to function as the normal keyboard installed in the keyboard-built-in type pc operation re-presentation device numbered as 81. It also functions, at the time of pa operation information reproduction, as the keyboard designed to input the identification number out of plural kinds of pc operation information stored in the memory numbered as 93 with each identification number given, at the operation of keyboard numbered as 82, into the microcomputer numbered as 92, and to reproduce the designated pc operation information.

In this figure, the memory numbered as 93 is shown as placed in the exterior of the one-chip microcomputer numbered as 92, but the installation of the memory in the interior of the one-chip microcomputer is also practicable.

Figure 12:
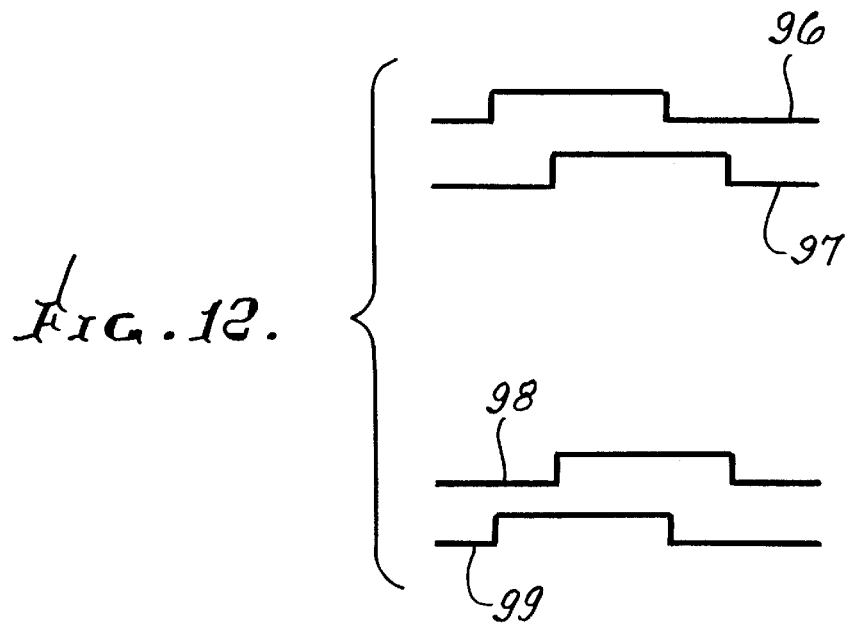
FIG. 12 is a diagram showing the timing of the driving pulse signal input into the mouse socket from the pc operation re-presentation device.

FIG. 12 is for the signal timing drawing for the aforementioned mouse operation reproduction signal. In case the input of pulse signal numbered as 96 to be input into the No. 2 terminal on the pc mouse socket is executed prior to that of pulse signal numbered as 97 to be input into the No. 3 terminal, the cursol is shifted to the right.

In case the input of pulse signal numbered as 96 to be input into the No. 4 terminal is executed prior to that of pulse signal numbered as 97 to be input into the No. 5 terminal, the cursol is shifted in the downward direction.

And, in case the input of pulse signal numbered as 98 to be input into the No. 2 terminal is executed subsequent to that of pulse signal numbered as 99 to be input into the No. 3 terminal, the cursol is shifted in the left direction, and in case the input of pulse signal numbered as 99 to be input into the No. 5 terminal, the cursor is shifted in the upward direction.

Figure 13:
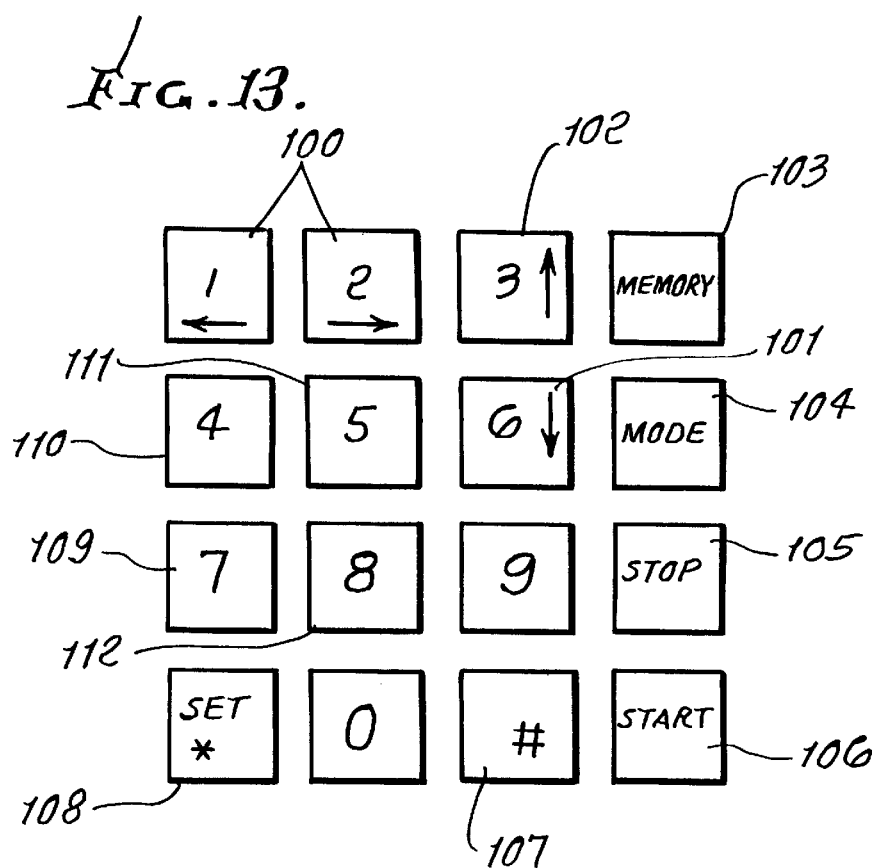
FIG. 13 is a key configuration re-presentation for the keyboard section.

FIG. 13 is for the key configuration drawing for the keyboard section. The number 100 is for the shift key designed to function as the right/left direction shift key and also as the numerical key. When this shift key is pressed on, the cursol starts, and when the shift key is pressed on again, the cursol stops.

The number 101 is for the shift key designed to function as the downward direction shift key and also as the numerical key. When this key is pressed on, the cursol starts, and when it is pressed on again, the cursol stops.

The number 102 is for the shift key designed to function as the upward direction shift key and also as the numerical key. When it is pressed on, the mouse cursol starts and when it is pressed on again, the cursol stops.

The number 103 is for the memory key designed to set up the memory mode of the device in question.

The number 104 is for the mode key designed to set up each mode.

The number 105 is for the stop key designed to stop functioning in progress in the course of various kinds of processes.

The number 106 is for the start key designed to start to operate the mouse operation data reproduction processes, and memory processes.

The number 107 is for the completion key designed to complete various kinds of processes.

The number 108 is for the "set" key designed to set the data in the memory during memory processes.

The number 109 is for the drag key designed to designate the mouse drag operation, as well as to function as the numerical key.

The number 110 is for the left click key designed to designate the mouse left click as well as to function as the numerical key.

The number 111 is for the double-click key designed to designate the mouse double click and to function as the numerical key.

The number 112 is for the right click key designed to designate the mouse right click as well as function as the numerical key.

Figure 14:
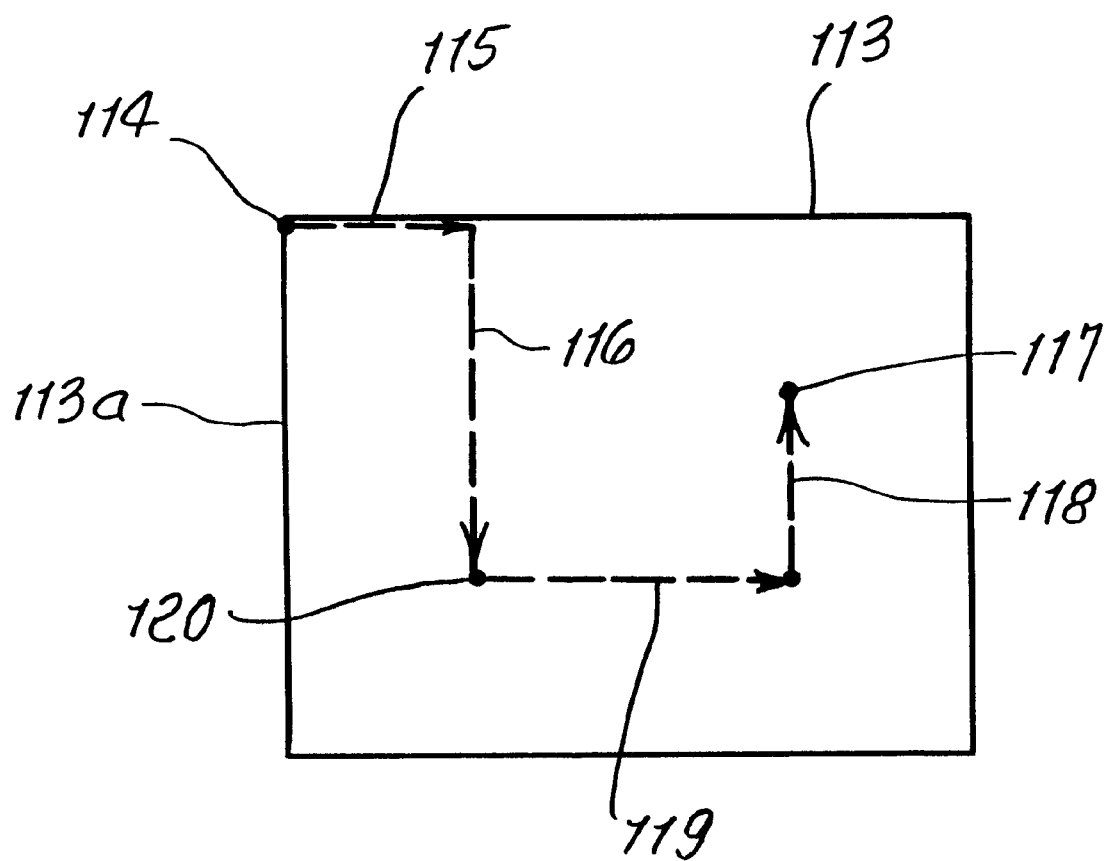
FIG. 14 is a drawing showing the display screen configuration at the time of key operation input.

FIG. 14 is for the display screen configuration at the time of key operation input.

The number 113 in this figure is for the pc display screen.

The number 113a is for the upper left section of the display screen with the origin of X-axis and Y-axis set as 0.

At the start-up of the pc operation data production/memory processes and their reproduction processes, the shift pulse of mouse cursol shift is input automatically from the device in question into the pc and their respective processes are automatically executed subsequent to the afore-mentioned origin of both axes being set as 0.

In the pc operation data production/memory processes, for example, when the mouse cursol is shifted up to the first designated point numbered as 118 at the operation of each kind of key shift as in FIG. 13 by the manual operation of the user, and the click key numbered as 110 is pressed, the pulse shift number data in accordance with the shift distance in the Y-axis direction numbered as 116 and the right direction code to identify the shift as the right direction are produced and stored into the memory.

Further on, the shift pulse data in accordance with the Y-axis direction shift distance numbered as 114 and the downward direction code to identify its shift as the downward direction are produced and stored in the memory.

Further on, the code data to generate the click signal and the time interval data from the start to the click are stored in the memory. In the same manner, at the first step, then at the second step, step by step, the pc operation data are produced and stored in the memory.

The number 115 is for the second step designated point.

The number 116 is for the shift distance in the Y-axis direction.

The number 117 is for the shift distance in the Y-axis direction.

Figure 15:
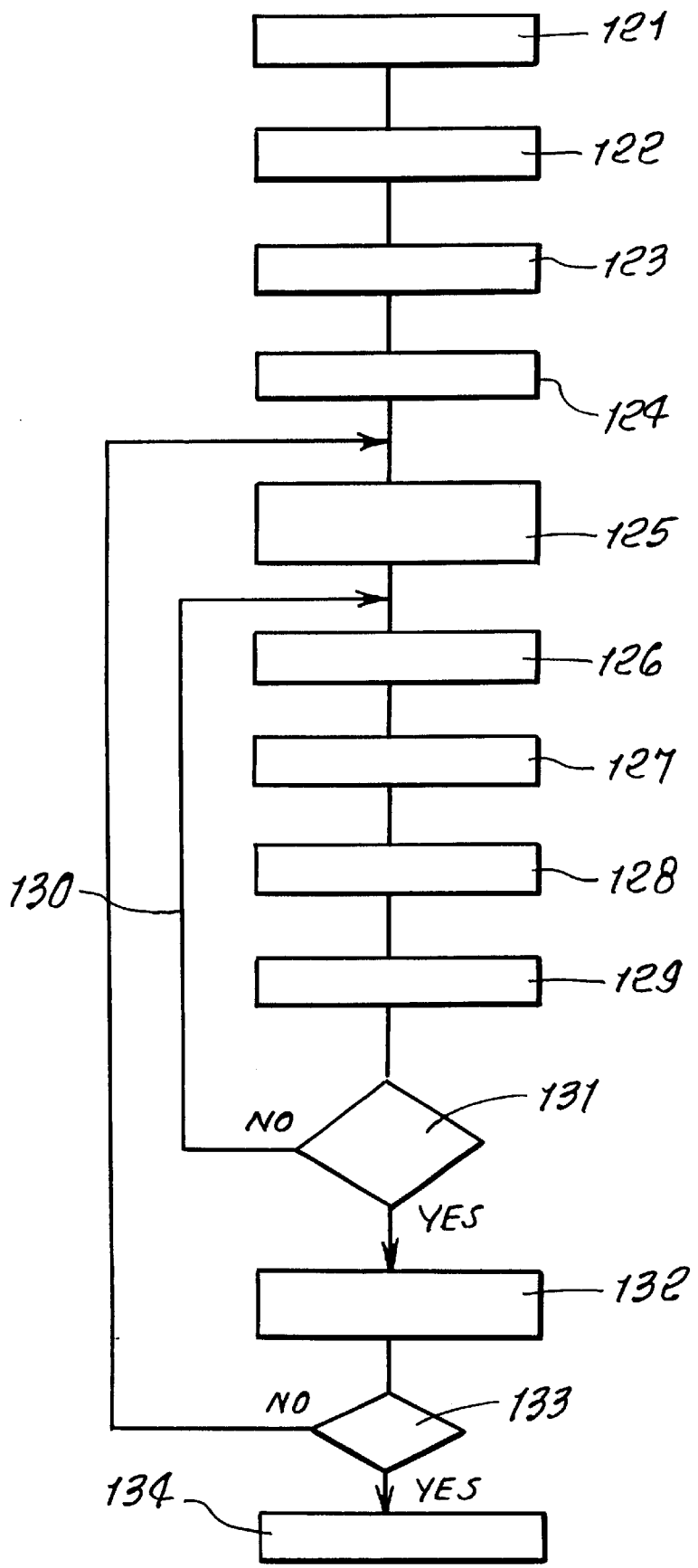
FIG. 15 is a flow chart for manual pc operation data production and its input process.

Next, FIG. 15 is the flow chart for the manual pc operation data production/input process.

At the operation of memory key ON numbered as 121, the pc operation data input processes start. Subsequently, the shift pulse is output automatically from the device in question, and the origin (original point) restoration processes numbered as 122 are executed.

Then, in the process numbered as 123, the address number for the pc operation data are input.

In the next process numbered as 124, when the start key is pressed, data production/input starts. In the process numbered as 125, the XY shift counter and the delay time counter are cleared and the count starts.

In the process numbered as 126, the user shifts the mouse cursol in the display screen to the first designated point.

At the operation of shift key, in combination with this operation, in the process numbered as 127, X and Y shift numbers are counted.

In the process numbered as 128, the shift direction of each is identified.

In the process numbered as 129, the time interval from the shift start to the mouse event happening such as the next click is counted.

In the process numbered as 131, the mouse cursor is shifted up to the designated position, and in the process numbered as 132, when the click or double click or set key is pressed, its respective counter value is read out and stored together with the retrieval number in the memory as the pc operation data.

In case the mouse cursol is not yet shifted up to the designated position, by the signal numbered as 130, the shift key process numbered as 127 is repeated.

Next, in the completion key detection process numbered as 133, in case it is not yet completed, it is restored to the process numbered as 125, moves to the next step, and repeats the same processes.

In case the completion key is pressed in the process numbered as 133, in case it is not yet completed, it is restored to the process numbered as 125, moves to the next step, and repeats the same processes.

In case the completion key is pressed in the process numbered as 133, the pc operation data reproduction/memory process is completed in the process numbered as 134.

As the different mouse operation information production/memory method, the up-down counter is installed in the internal circuitry of the invention, the pc operation information re-presentation device. And, at the direct operation mode in the pc operation information re-presentation device, the user sets up the mouse signal in operation so that it is input into the pc mouse socket as it is.

In this condition, the number of shift pulse input into the afore-mentioned mouse socket is counted by the up-down counter, and the shift pulse number from the shift starting point to the next mouse clicking point is detected according to the count value counted by the up/down counter in the meantime, and each shift value data for X-axis and Y-axis is computed out and compiled.

The process numbered as 122, the automatic original point restoration process as in FIG. 15 is always executed in the beginning of the reproduction process where the pc operation information is reproduced and the pc operation is re-presented.

After the shift pulse generated from the pc operation re-presentation device independently is input into the pc and the cursol in the pc display screen is shifted to zero position both at X-axis and Y-axis in the upper left section of the display screen, the initial set-up process (drawing omitted) where the afore-mentioned pc operation re-presentation process starts this process is automatically executed.

In the actual instance of the practiced invention in question, the explanation has been made abut the method for inputting the pc operation information prepared by the pc expert or the pc oriented individual, into the invention in question, the pc operation re-presentation device and storing this information in the memory.

Also practicable is the method for installing the memory of large capacity where the pre-memorized pc operation information data is written in, at the time of actual production of the device in question.

Also practicable is the method for inputting from the pc the pc operation information transmitted into the pa via telecommunication circuit, into the invention in question the pc operation re-presentation device and storing this information in the memory of the microcomputer.

In the actual case of the practiced invention in question, the explanation has been made about the pc operation information re-presentation device installing the microcomputer system to memorize and reproduce the afore-mentioned pc operation information in the mouse and the keyboard.

However, also practicable is the method for installing the afore-mentioned microcomputer system in the card to be used by insertion into the pc card slot and also the method for installing this microcomputer system in the pc motherboard at the time of actual production of the device in question.

Also practicable is the method for additionally installing in the microcomputer for the portable handy system telephone control the memory/reproduction/control of the afore-mentioned pc operation information for the mouse operation reproduction, turning telephone function to pc function by change-over switch, and outputting the afore-mentioned pc operation re-presentation signal from the portable handy system telephone to control the pc.

EFFECTIVENESS OF THE INVENTION

The invention in question —the pc operation re-presentation device is designed to make possible the re-presentation of the same pa operations repeated many a time, by the mere operation of the start-up button and to save a lot of trouble.

This device is also designed to obtain the information by means of automatic connection and disconnection to the internet during the night time, and also to provide assistance to the inexperienced operator.

It is also designed to make the pc start-up operation and its arrival at the designated display screen fully automatic.

The device in question is also designed to demonstrate and explain every sort of pc operation as the instruction/demonstration software, in place of the instruction manual attached to the pc.

It is also designed to demonstrate/explain the initial set-up method and software usage.

Along with the pc, the device in question is also designed to demonstrate/explain how to make initial set-up and how to use the respective software, and also designed to make it possible to explain how to use the word-processor software and drawing software.

In addition, the device in question is also designed to demonstrate/explain how to install the pc software and how to make initial set-up, and also designed to make software installation fully automatic.

The device is also designed to demonstrate/explain how to make its connection to the internet and how to prepare condition on set-up.

The device can be utilized as the software for the pc educational orientation as well as for the education.

Its application to the game software like the competition game software is also possible.

I claim:

1. In combination with a personal computer having internal driving circuitry, a key data input keyboard, and a mouse for computer cursor control, the improvement apparatus for effecting re-presentation by the computer of selected pre-prepared start-up data, comprising
    a) a microcomputer associated with the mouse and having memory to store start-up
        i) mouse operation data,
        ii) key operation data, and
        iii) associated operation time interval data, which has been pre-prepared,
    b) there being a mouse signal line or lines to the computer internal circuitry, and a mouse keyboard signal line or lines to the computer internal circuitry,
    c) said microcomputer controllably connected to said mouse signal line or lines and to said mouse keyboard signal line or lines to transmit from said memory to the computer internal circuitry stored, pre-prepared i), ii), and iii) data, to thereby automatically effect start-up drive control of the computer,
    d) the computer having an input port for signals from the key data input keyboard, and there being an auxiliary socket connection to said port to which both the key data input keyboard and the mouse keyboard signal line or lines are connected.

2. The combination of claim 1 wherein the microcomputer has a chip for controlling computer operation, said chip incorporating said memory.

3. The combination of claim 2 wherein the mouse has a hand manipulable housing, said chip located within said housing.

4. The combination of claim 3 wherein the mouse has a keyboard operable to select an identification code and to select one group of computer operation information associated with one designated task chosen from plural groups of computer operation information stored in said memory, for quickly effecting a pre-chosen mode of operation as presented at the computer screen.

5. The combination of claim 1 wherein the keyboard has a housing, said chip located within said housing.

6. The combination of claim 1 characterized in that, at the start of the re-presentation process by operation of said microcomputer and after the cursor in the display screen is shifted to the zero(0) position of X-axis and Y-axis at a corner of the display screen by re-presentation of the computer operation information, means is provided for inputting a shift pulse generated independently of said apparatus into the mouse signal line or lines.

7. The combination of claim 6 including means for shifting the mouse controlled cursor at the display screen in up/down right/left directions by inputting a mouse driving signal to the computer via a button operation.

8. The combination of claim 6 including means for counting the number of shift pulses at the time of cursor shifting.

9. The combination of claim 7 including means for storing mouse cursor operation data inclusive of the shift pulse number, in the microcomputer memory at the mouse, whereby in response to button operation the mouse cursor is shifted to a designated display screen position, and at this position, by pushing the designated button, the shift pulse number data is produced in accordance with the shifting distance of the mouse cursor in the X-axis and Y-axis directions, and the mouse data inclusive of click operation and time interval data from click to click are produced and stored in said memory.

10. In combination with computer apparatus having a CRT screen and driving circuitry, a keyboard and a keyboard signal connection to the computer, and a mouse and mouse signal connections to the computer, for cursor control, the improvement comprising;
   a) a control device associated with the mouse to provide computer operation re-presentation data,
   b) and re-presentation data transmission paths between said device and the computer, said paths associated with said keyboard signal connection to the computer,
   c) the keyboard having a line terminating at a first socket connectible to the computer, there being a first auxiliary socket connected with said device and connectable to said first socket, said first auxiliary socket connected to a computer data input port,
   d) and including a first cable extending between the mouse and said first auxiliary socket for electrical connection to said device at the mouse,
   e) and wherein said mouse signal connections include a second socket, in the data transmission path from the device to the computer, and including a second cable connected to said second socket and electrically connected to said device at the mouse,
   f) and wherein the mouse signal connections include a third socket, in the data transmission path to the device from the computer, and including a third cable connected to said third socket, and electrically connected to said device at the mouse.

11. In the method of reducing the time required for start-up of a computer, requiring operation of a keyboard to enter start-up data to achieve presentation on the computer monitor screen of a desired visual mode, the computer having an associated data entry keyboard, and a cursor controlling mouse, the steps including
   a) providing a minicomputer associated with the mouse and having a memory for data storage,
   b) effecting entry into the memory at the microcomputer, and storage, of said start-up data otherwise requiring entry into the computer via keying operation of the keyboard, upon start-up,
   c) and, upon start-up of the computer, effecting automatic transmission to the computer from said memory of said start-up data, to achieve rapid desired mode presentation at the monitor screen,
   d) and providing an auxiliary socket for transmission via an existing computer port of both keyboard data and said start-up data.

12. The method of claim 1 wherein said automatic transmission of said start-up data is effected in by-passing relation to the keyboard.

13. The method of claim 1 also including, upon start-up of the computer, effecting automatic transmission from the memory at the mouse of at least part of said start-up data, via a mouse data transmission terminal provided at the computer.

14. The method of claim 11 including providing a key-pad at the mouse, for selectively entering into said memory of different signals respectively associated with different groups of said start-up data, said automatic transmission effected to transmit to the computer a selected group of said start-up data.

15. The combination of claim 1 wherein said microcomputer is located at one of the following:
   $x_1$) at the mouse
   $x_2$) at the keyboard
   $x_3$) at a card slot defined by the personal computer
   $x_4$) at a motherboard defined by the personal computer
   $x_5$) at a portable telephone function device.

* * * * *